(12) United States Patent
Kawaguchi et al.

(10) Patent No.: US 12,226,805 B2
(45) Date of Patent: Feb. 18, 2025

(54) SUBSTRATE CLEANING BRUSH

(71) Applicant: AION CO., LTD., Osaka (JP)

(72) Inventors: Tadashi Kawaguchi, Koga (JP); Tomoyuki Nakagaki, Koga (JP)

(73) Assignee: AION CO., LTD., Osaka (JP)

( * ) Notice: Subject to any disclaimer, the term of this patent is extended or adjusted under 35 U.S.C. 154(b) by 404 days.

(21) Appl. No.: 17/614,270

(22) PCT Filed: May 27, 2020

(86) PCT No.: PCT/JP2020/021024
§ 371 (c)(1),
(2) Date: Nov. 24, 2021

(87) PCT Pub. No.: WO2020/241726
PCT Pub. Date: Dec. 3, 2020

(65) Prior Publication Data
US 2022/0212234 A1 Jul. 7, 2022

(30) Foreign Application Priority Data
May 28, 2019 (JP) ................................ 2019-099190

(51) Int. Cl.
*B08B 1/12* (2024.01)
*A46B 13/00* (2006.01)
(Continued)

(52) U.S. Cl.
CPC .............. *B08B 1/12* (2024.01); *A46B 13/008* (2013.01); *A46B 13/02* (2013.01); *B08B 1/32* (2024.01);
(Continued)

(58) Field of Classification Search
CPC .. B08B 1/003; B08B 1/04; B08B 1/32; B08B 1/12; A46B 9/005; A46B 2200/3073; A46B 13/02; A46B 13/008; H01L 21/67046
(Continued)

(56) References Cited

U.S. PATENT DOCUMENTS

| 10,625,308 B2* | 4/2020 | Ishibashi ................ A46B 13/02 |
| 2004/0074029 A1* | 4/2004 | Oikawa .................... B08B 1/00 |
| | | 15/88.2 |

FOREIGN PATENT DOCUMENTS

| JP | 09-181025 A | 7/1997 |
| JP | 2000-173966 A | 6/2000 |

(Continued)

OTHER PUBLICATIONS

International Search Report for PCT/JP2020/021024 dated Jul. 21, 2020.
Written Opinion for PCT/JP2020/021024 dated Jul. 21, 2020.

*Primary Examiner* — Katina N. Henson
(74) *Attorney, Agent, or Firm* — Sughrue Mion, PLLC

(57) ABSTRACT

In a holder attached state in which a holder upper part 11 is attached to a brush rotation shaft 2, the lower surface of the holder upper part 11 and the inner peripheral surface of a holder lower part 18 define a brush accommodating space 23, and the inner peripheral edge of a holder bottom plate part 19 defines a circular holder opening 24 having a smaller diameter than the inner diameter of the holder lower part 18. A held part 31 of a brush body 30 is in a circular column shape incapable of penetrating through the holder opening 24, and is accommodated and held in the brush accommodating space 23. A cleaning part 32 of the brush body 30 is in a circular column shape smaller in diameter than the held part 31 and capable of penetrating through the holder opening 24, and penetrates through the holder opening 24

(Continued)

and projects downward. A top-to-bottom length L2 of the holder opening 24 of the brush holder 10 is longer than or equal to ¼ of a protruding length L1 of the cleaning part 32 of the brush body 30 from the held part 31 thereof and shorter than the protruding length L1 of the cleaning part 32.

6 Claims, 2 Drawing Sheets

(51) Int. Cl.
*A46B 13/02* (2006.01)
*B08B 1/32* (2024.01)
*H01L 21/67* (2006.01)

(52) U.S. Cl.
CPC . *A46B 2200/3073* (2013.01); *H01L 21/67046* (2013.01)

(58) Field of Classification Search
USPC .......................................................... 15/88.2
See application file for complete search history.

(56) References Cited

FOREIGN PATENT DOCUMENTS

| | | |
|---|---|---|
| JP | 2002-028584 A | 1/2002 |
| JP | 2003-017454 A | 1/2017 |
| KR | 10-2002-0022220 A | 3/2002 |
| KR | 10-2011-0048220 A | 5/2011 |

* cited by examiner

SUBSTRATE CLEANING BRUSH

CROSS REFERENCE TO RELATED APPLICATIONS

This application is a National Stage of International Application No. PCT/JP2020/021024 filed May 27, 2020, claiming priority based on Japanese Patent Application No. 2019-099190 filed May 28, 2019.

TECHNICAL FIELD

The present invention relates to a substrate cleaning brush which, when used, is attached to a substrate cleaning apparatus that performs brush cleaning on a substrate.

BACKGROUND ART

Patent Literature 1 discloses a substrate cleaning brush configured to hold a brush body in a brush holder including an upper attachment part and a lower holding part. The upper half of the brush body is a large diameter part while the lower half is a small diameter part smaller in diameter than the large diameter part. The brush body is made of a porous material that has continuous pores formed therein, is hydrophilic, and exhibits good flexibility and elasticity when moistened. On a center portion of the upper surface of the upper attachment part of the brush holder, a locking portion for attaching the substrate cleaning brush to a brush rotation shaft of a substrate cleaning apparatus is integrally provided in a protruding fashion. The inner diameter of the lower holding part of the brush holder is slightly larger than the outer diameter of the large diameter part of the brush body, and an annular support is integrally formed on the inner peripheral surface of the lower holding part near its lower end. The inner diameter of the annular support is slightly larger than the outer diameter of the small diameter part of the brush body and smaller than the outer diameter of the large diameter part.

To mount the brush body in the brush holder, the small diameter part of the brush body is inserted into the circular hole in the annular support of the lower holding part to thereby accommodate the brush body in the lower holding part, and then a fitting portion of the upper attachment part is fitted to an upper end portion of the lower holding part. This leads to a state where the brush body is held in the brush holder and the lower end surface of the brush body sticks out downward from the lower end of the lower holding part.

The substrate cleaning is performed by attaching the substrate cleaning brush to the brush rotation shaft on a brush holding arm of the substrate cleaning apparatus, rotating the substrate held by a spin chuck about a vertical axis with a cleaning liquid, such as pure water, supplied onto the substrate, lowering the substrate cleaning brush while causing it to rotate to thereby bring the lower surface of the brush body into contact with the surface of the substrate and, in this state, moving the substrate cleaning brush along the surface of the substrate from a center portion of the substrate toward a peripheral edge portion thereof.

CITATION LIST

Patent Literature

Patent Literature 1: Japanese Patent Application Publication No. Hei 9-181025

SUMMARY OF INVENTION

Technical Problem

In the cleaning with the substrate cleaning brush of Patent Literature 1, the lower surface of the small diameter part of the brush body moves over the surface of the substrate, and the soft small diameter part is elastically deformed in the radial direction in such a way as to slope relative to the rotation axis (vertical axis). For this reason, the contact pressure of the small diameter part on the surface of the substrate also varies according to the elastic deformation of the small diameter part in the radial direction. Thus, if the length, in the up-down direction, of the small diameter part that can be elastically deformed in the radial direction is excessively large, the contact pressure of the small diameter part will be large as well, which will make it difficult to evenly clean the cleaning target surface of the substrate. Hence, in order to evenly clean the cleaning target surface, the length, in the up-down direction, of the small diameter part that can be elastically deformed in the radial direction is preferably minimized within such a range as not to impair the cleaning effect of the small diameter part (a range within which elastic deformation occurs so as to bring about a desired cleaning effect).

However, the substrate cleaning brush of Patent Literature 1 is such that the small diameter part penetrates through the circular hole in the thin plate-shaped annular support, and the length of the circular hole in the up-down direction is significantly small as compared to the protruding length of the small diameter part from the large diameter part. Thus, the length, in the up-down direction, of the small diameter part that can be elastically deformed in the radial direction is excessively large. This may result in failure to evenly clean the cleaning target surface.

In view of the above, an object of the present invention is to provide a substrate cleaning brush suitable for evenly cleaning an entire cleaning target surface of a substrate.

Solution to Problem

To achieve the above object, a first aspect of the present invention provides a substrate cleaning brush that cleans a substrate by rotating together with a brush rotation shaft of a substrate cleaning apparatus whose axis extends in an up-down direction, and includes a brush holder and a brush body.

The brush holder has a holder upper part, a holder lower part, and a holder bottom plate part. The holder upper part is attached to a lower end of the brush rotation shaft. The holder lower part is in a cylindrical shape extending downward from the holder upper part in a holder attached state in which the holder upper part is attached to the brush rotation shaft. The holder bottom plate part is in a hollow disc shape protruding radially inward from an inner edge of a lower end of the holder lower part in the holder attached state. In the holder attached state, a lower surface of the holder upper part, an inner peripheral surface of the holder lower part, and an upper surface of the holder bottom plate part define a brush accommodating space, an inner peripheral edge of the holder bottom plate part defines a circular holder opening having a smaller diameter than an inner diameter of the holder lower part, and a center axis of the brush accommodating space and a center axis of the holder opening substantially coincide with the axis of the brush rotation shaft.

The brush body integrally has a held part and a cleaning part. The held part has a circular column shape that is incapable of penetrating through the holder opening and is accommodated and held in the brush accommodating space. The cleaning part has a circular column shape that is smaller in diameter than the held part and capable of penetrating through the holder opening, and penetrates through the holder opening and projects downward in a brush attached state in which the held part is held in the brush accommodating space in the holder attached state. In the brush attached state, the brush body lets a lower surface of the cleaning part contact the substrate from above to clean the substrate.

A top-to-bottom length of the holder opening of the brush holder is longer than or equal to ¼ of a protruding length of the cleaning part of the brush body from the held part thereof and shorter than the protruding length of the cleaning part. Note that, considering the cleaning ability of the cleaning part, the top-to-bottom length of the holder opening is preferably ⅔ of the protruding length of the cleaning part or longer.

In the case of cleaning the cleaning target surface of the substrate, the lower surface of the cleaning part of the brush body rotating about the brush rotation shaft is pressed against the cleaning target surface from above and moved over the cleaning target surface. In this movement, the cleaning part is elastically deformed in the radial direction in such a way as to slope relative to the brush rotation shaft.

With the above configuration, the top-to-bottom length of the holder opening of the brush holder is longer than or equal to ¼ of the protruding length of the cleaning part of the brush body from the held part thereof and shorter than the protruding length of the cleaning part. Thus, the held part side (upper end side) of the cleaning part of the brush body in a top-to-bottom length range of ¼ of the protruding length of the cleaning part or longer is restricted from being elastically deformed in the radial direction by the holder opening. In this way, the length of the cleaning part in the up-down direction that can be elastically deformed in the radial direction can be minimized within such a range as not to impair the cleaning effect of the cleaning part (a range within which elastic deformation occurs so as to bring about a desired cleaning effect). Accordingly, the entire cleaning target surface can be evenly cleaned.

A second aspect of the present invention is the substrate cleaning brush according to the first aspect, in which the brush holder has a cylindrical brush deformation restricting part protruding downward from the inner peripheral edge of the holder bottom plate part in the holder attached state, and an inner peripheral surface of the brush deformation restricting part defines the holder opening with the inner peripheral edge of the holder bottom plate part.

With the above configuration, the brush deformation restricting part protruding downward from the inner peripheral edge of the holder bottom plate part is provided, and the holder opening is defined by the inner peripheral edge of the holder bottom plate part and the inner peripheral surface of the brush deformation restricting part. This eliminates the need to increase the thickness of the holder bottom plate part according to the top-to-bottom length of the holder opening.

A third aspect of the present invention is the substrate cleaning brush according to the first or second aspect, in which, on the inner peripheral surface of the holder lower part, a plurality of protrusions are formed which elastically deform part of an outer peripheral surface of the held part of the brush body accommodated in the brush accommodating space radially inward.

With the above configuration, the plurality of protrusions of the holder lower part can suppress rotation of the held part of the brush body relative to the brush holder.

Advantageous Effect of Invention

According to the present invention, it is possible to evenly clean an entire cleaning target surface of a substrate.

DESCRIPTION OF EMBODIMENTS

A substrate cleaning brush (hereinafter referred to simply as cleaning brush) 1 according to an embodiment of the present invention will be described with reference to FIGS. 1 to 3.

Figure 2:
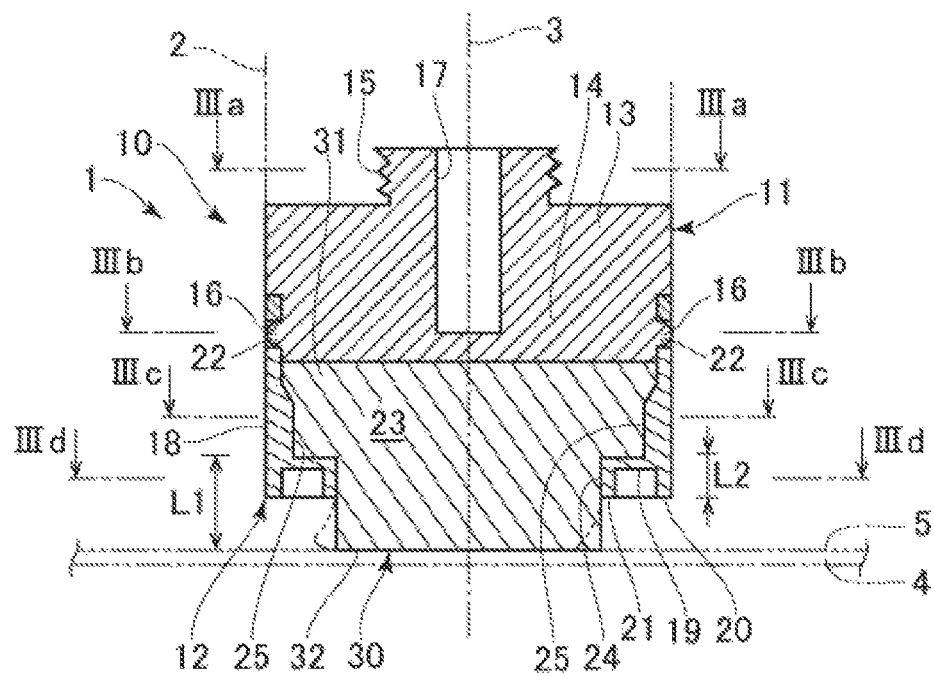
FIG. 2 is a cross-sectional view of the substrate cleaning brush in a state where the brush body in FIG. 1 is mounted in the brush holder in FIG. 1.

As illustrated in FIG. 2, the cleaning brush 1 includes a brush holder 10 and a brush body 30 and, when used, is attached to the lower end of a brush rotation shaft 2 of a substrate cleaning apparatus. An axis 3 of the brush rotation shaft 2 extends in an up-down direction (substantially vertical direction), and the cleaning brush 1 rotates together with the brush rotation shaft 2 to perform brush cleaning on a cleaning target surface 5 of a substrate 4 (substantially entire upper surface of the substrate 4). The substrate 4 to be cleaned is any of various substrates such, for example, as a semiconductor wafer, a glass substrate for a liquid crystal display apparatus or a photomask, and a substrate for an optical disk, and the substrate cleaning apparatus performs brush cleaning by holding the substrate 4 in a horizontal orientation and rotating it about a vertical axis (axis 3) with a cleaning liquid supplied onto the cleaning target surface 5.

Figure 1:
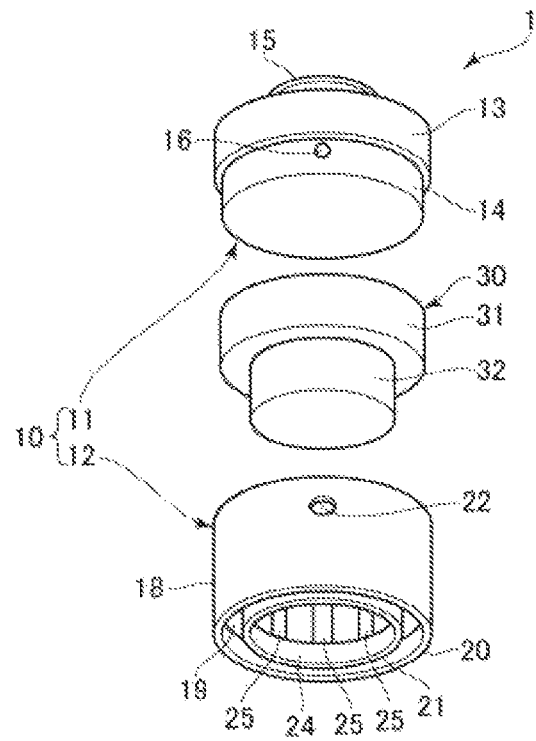
FIG. 1 is an exploded perspective view of a substrate cleaning brush according to an embodiment of the present invention.
Figure 3:
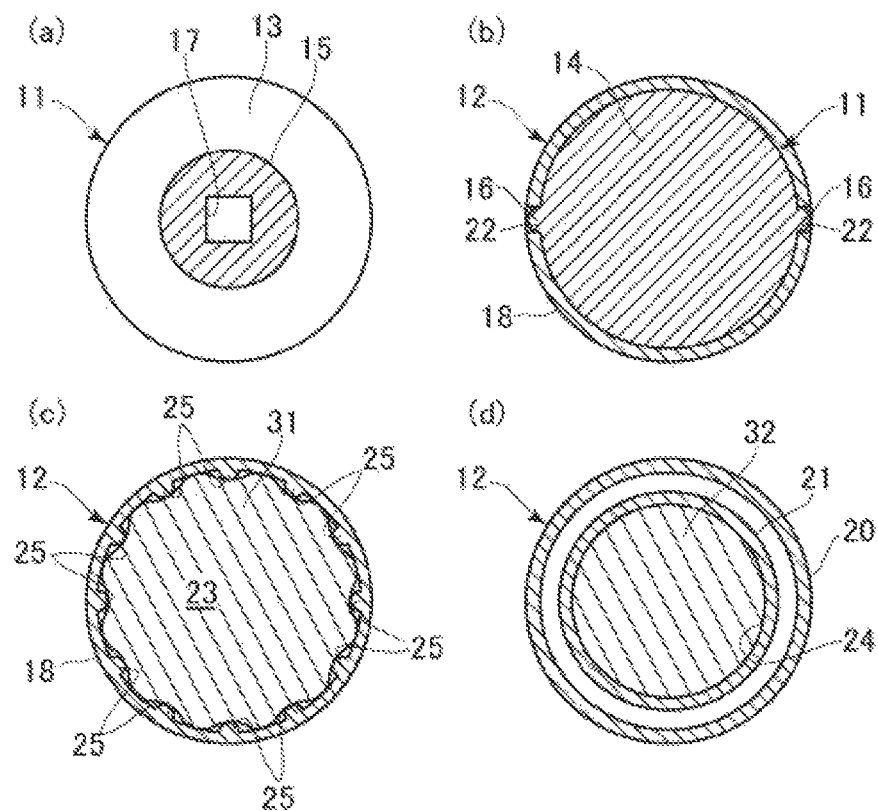
FIG. 3 is a set of horizontal cross-sectional views of FIG. 2, with FIGS. 3(*a*), 3(*b*), 3(*c*), and 3(*d*) illustrating a cross section, a IIIb-IIIb cross section, a IIIc-IIIc cross section, and a IIId-IIId cross section, respectively.

As illustrated in FIGS. 1 to 3, the brush holder 10 includes an upper holder (holder upper part) 11 and a lower holder 12. The upper holder 11 and the lower holder 12 are made of a hard resin material, such as polypropylene, for example, and are combined together by assembling the lower holder 12 to the upper holder 11.

The upper holder 11 integrally has a disc-shaped upper-holder large diameter part 13, a disc-shaped upper-holder small diameter part 14 slightly smaller in diameter than the upper-holder large diameter part 13, and a holder male screw part 15 with a male thread formed on its outer peripheral surface, and the upper-holder large diameter part 13, the upper-holder small diameter part 14, and the holder male screw part 15 are provided coaxially. The upper-holder small diameter part 14 protrudes downward from the lower surface of the upper-holder large diameter part 13, and the holder male screw part 15 protrudes upward from the upper surface of the upper-holder large diameter part 13. On the outer peripheral surface of the upper-holder small diameter part 14, a plurality (two in this embodiment) of locking protrusions 16 are provided in a protruding fashion. In the upper surface of the holder male screw part 15, a rectangular hole 17 with a closed bottom is formed to extend downward.

The upper holder 11 is attached to the lower end of the brush rotation shaft 2 by inserting a rectangular shaft (not illustrated) on the brush rotation shaft 2 side of the substrate cleaning apparatus into the rectangular hole 17 and screwing a nut (not illustrated) to the holder male screw part 15, and rotates together with the brush rotation shaft 2.

The lower holder 12 integrally has a cylindrical holder lower part 18, a hollow disc-shaped holder bottom plate part 19, a cylindrical brush cover part 20, and a cylindrical brush deformation restricting part 21, and the holder lower part 18, the holder bottom plate part 19, the brush cover part 20, and the brush deformation restricting part 21 are provided coaxially.

The outer diameter of the holder lower part 18 is made substantially equal to the outer diameter of the upper-holder large diameter part 13, and the inner diameter of the holder lower part 18 is made substantially equal to or slightly larger than the outer diameter of the upper-holder small diameter part 14. In one end portion (upper end portion) of the holder lower part 18, a plurality (two in this embodiment) of locking holes 22 are formed which the locking protrusions 16 of the upper-holder small diameter part 14 can be inserted into and engaged with. The lower holder 12 is fixedly attached to the upper holder 11 by inserting the lower end of the upper-holder small diameter part 14 into the holder lower part 18 from above and engaging the locking protrusions 16 with the locking holes 22.

The holder lower part 18 extends downward from the upper holder 11 in a holder attached state in which the lower holder 12 is attached to the upper holder 11 and the upper holder 11 is attached to the brush rotation shaft 2. In the holder attached state, the holder bottom plate part 19 protrudes radially inward from the inner edge of the lower end of the holder lower part 18. The brush cover part 20 has a cylindrical shape with a diameter equal to that of the holder lower part 18 and, in the holder attached state, extends downward continuously from the lower end of the holder lower part 18. The brush deformation restricting part 21 has a cylindrical shape with a diameter smaller than that of the brush cover part 20 and, in the holder attached state, protrudes downward from the inner peripheral edge of the holder bottom plate part 19. The protruding height of the brush cover part 20 and the protruding height of the brush deformation restricting part 21 from the holder bottom plate part 19 can each be set as desired. In this embodiment, both are set at a substantially equal protruding height.

In the holder attached state, the lower surface of the upper holder 11, the inner peripheral surface of the holder lower part 18, and the upper surface of the holder bottom plate part 19 define a brush accommodating space 23. Together with the inner peripheral surface of the brush deformation restricting part 21, the inner peripheral edge of the holder bottom plate part 19 defines a circular holder opening 24 with a smaller diameter than the inner diameter of the holder lower part 18 (the diameter of the inner peripheral surface of the holder lower part 18). Also, the center axis of the brush accommodating space 23 and the center axis of the holder opening 24 substantially coincide with the axis 3 of the brush rotation shaft 2.

The brush body 30 is made of a spongy porous material having hydrophilicity, and integrally has a circular column-shaped held part 31 and a circular column-shaped cleaning part 32 smaller in diameter than the held part 31. The porous material is, for example, a porous material using PVA as its raw material (PVAt-based porous material). The PVAt-based porous material is manufactured by, for example, generating polyvinyl formal by a formalizing reaction in which formaldehyde is bonded to PVA with an acid as a catalyst, during which a pore generating agent is added to form pores, to thereby complete an insoluble porous substrate, and thereafter extracting the pore generating agent. The brush body 30 made of the PVAt-based porous material has continuous pores formed in its entire body, is hydrophilic, has good flexibility and elasticity when moistened, and loses the elasticity and hardens when dried.

The held part 31 has such an outer diameter as to be incapable of penetrating through the holder opening 24 (an outer diameter larger than the holder opening 24), and is accommodated and held in the brush accommodating space 23. The cleaning part 32 is smaller in diameter than the held part 31 and has such an outer diameter as to be capable of penetrating through the holder opening 24, and penetrates through the holder opening 24 and projects downward in a brush attached state in which the held part 31 is held in the brush accommodating space 23 in the holder attached state. To mount the brush body 30 in the brush holder 10, the upper holder 11 and the lower holder 12 are detached from each other, the cleaning part 32 is inserted into the holder opening 24 of the lower holder 12 and the held part 31 is also accommodated in the brush accommodating space 23, and then the lower holder 12 is attached to the upper holder 11. As a result, the held part 31 is sandwiched between and held by the lower surface of the upper holder 11 and the upper surface of the holder bottom plate part 19. During brush cleaning with the brush body 30, the lower surface of the cleaning part 32 contacts the cleaning target surface 5 of the substrate 4 from above.

On the inner peripheral surface of the holder lower part 18, a plurality of protrusions 25 that elastically deform part of the outer peripheral surface of the held part 31 accommodated in the brush accommodating space 23 radially inward are integrally provided in a protruding fashion. In this embodiment, 12 protrusions 25 having a semicircular arc shape and extending in the up-down direction are formed at substantially equal intervals in the circumferential direction.

A top-to-bottom length L2 of the holder opening 24 of the brush holder 10 is set to be longer than or equal to ¼ of a protruding length L1 of the cleaning part 32 of the brush body 30 from the held part 31 thereof and shorter than the protruding length L1 of the cleaning part 32 (L1>L2≥L1/4). In this embodiment, in consideration of the cleaning ability of the cleaning part 32, the top-to-bottom length L2 of the holder opening 24 is set within a range of ¼ to ⅔ of the protruding length L1 of the cleaning part 32 (L1×2/3≥L2≥L1/4).

In the case of attaching the cleaning brush 1 to the brush rotation shaft 2 of the substrate cleaning apparatus and performing brush cleaning on the cleaning target surface 5 of the substrate 4, for example, the substrate 4 held by a spin chuck (not illustrated) is rotated about the vertical axis with a cleaning liquid, such as pure water, supplied onto the cleaning target surface 5 of the substrate 4, and the cleaning brush 1 is lowered from an upper position while being caused to rotate to thereby bring the lower surface of the cleaning part 32 of the brush body 30 into contact with the cleaning target surface 5, and in this state, the cleaning brush 1 is moved along the cleaning target surface 5 from a center portion of the substrate 4 toward a peripheral edge portion thereof. Since, as described above, the lower surface of the cleaning part 32 of the brush body 30 rotating about the axis 3 of the brush rotation shaft 2 is pressed against the cleaning target surface 5 from above and moved over the cleaning target surface 5, the cleaning part 32 is elastically deformed in the radial direction in such a way as to slope relative to the brush rotation shaft 2 (axis 3).

In this embodiment, the top-to-bottom length L2 of the holder opening 24 of the brush holder 10 is longer than or equal to ¼ of the protruding length L1 of the cleaning part 32 of the brush body 30 from the held part 31 thereof and shorter than the protruding length L1 of the cleaning part 32. Thus, the upper end side of the cleaning part 32 of the brush body 30 in a top-to-bottom length range of ¼ of the protruding length L1 of the cleaning part 32 or longer is restricted from being elastically deformed in the radial direction by the holder opening 24. In this way, the length of the cleaning part 32 in the up-down direction that can be elastically deformed in the radial direction can be minimized within such a range as not to impair the cleaning effect of the cleaning part 32 (a range within which elastic deformation occurs so as to bring about a desired cleaning effect). Accordingly, the entire cleaning target surface 5 can be evenly cleaned.

Moreover, the brush deformation restricting part 21 protruding downward from the inner peripheral edge of the holder bottom plate part 19 is provided, and the holder opening 24 is defined by the inner peripheral edge of the holder bottom plate part 19 and the inner peripheral surface of the brush deformation restricting part 21. This eliminates the need to increase the thickness of the holder bottom plate part 19 according to the top-to-bottom length L2 of the holder opening 24.

Furthermore, the plurality of protrusions 25 of the holder lower part 18 can suppress rotation of the held part 31 of the brush body 30 relative to the brush holder 10. This can further improve the cleaning performance.

Note that the present invention is not limited to the embodiment exemplarily described above and its examples, and various changes can be made outside the above embodiment and the like according to the design and the like without departing from the technical idea of the present invention.

Figure 4:
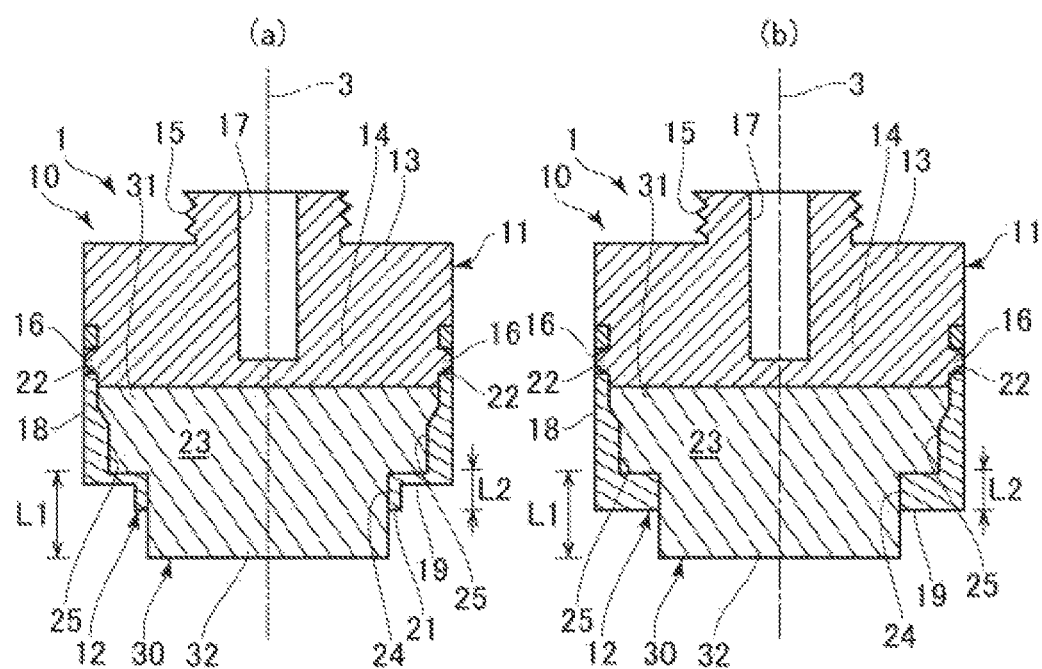
FIG. 4 is a set of cross-sectional views of substrate cleaning brushes in examples in which the brush body in FIG. 1 is mounted in brush holders of other configurations, with FIG. 4(*a*) representing a first modification and FIG. 4(*b*) representing a second modification.

For example, as illustrated in FIG. 4(a), the brush holder 10 may omit the brush cover part 20 (see FIG. 2). Moreover, as illustrated in FIG. 4(b), the brush cover part 20 and the brush deformation restricting part 21 (see FIG. 2) may be omitted and the holder bottom plate part 19 may be formed thicker to extend the top-to-bottom length of the holder opening 24 to a desired length.

INDUSTRIAL APPLICABILITY

The present invention is useful as a substrate cleaning brush which, when used, is attached to a substrate cleaning apparatus that performs brush cleaning on a substrate.

REFERENCE SIGNS LIST 1 substrate cleaning brush
2 brush rotation shaft
3 axis of brush rotation shaft
4 substrate
5 cleaning target surface
10 brush holder
11 upper holder (holder upper part)
12 lower holder
13 upper-holder large diameter part
14 upper-holder small diameter part
15 holder male screw part
16 locking protrusion
17 rectangular hole
18 holder lower part
19 holder bottom plate part
20 brush cover part
21 brush deformation restricting part
22 locking hole
23 brush accommodating space
24 holder opening
25 protrusion
30 brush body
31 held part
32 cleaning part
L1 protruding length of cleaning part
L2 top-to-bottom length of holder opening

The invention claimed is:

1. A substrate cleaning brush that cleans a substrate by rotating together with a brush rotation shaft of a substrate cleaning apparatus whose axis extends in an up-down direction, comprising:
    a brush holder that has
        a holder upper part to be attached to a lower end of the brush rotation shaft,
        a cylindrical holder lower part extending downward from the holder upper part in a holder attached state in which the holder upper part is attached to the brush rotation shaft,
        a hollow disc-shaped holder bottom plate part protruding radially inward from an inner edge of a lower end of the holder lower part in the holder attached state, and
        a cylindrical brush deformation restricting part protruding downward from the inner peripheral edge of the holder bottom plate part in the holder attached state,
    in the holder attached state, a lower surface of the holder upper part, an inner peripheral surface of the holder lower part, and an upper surface of the holder bottom plate part defining a brush accommodating space, an inner peripheral edge of the holder bottom plate part and an inner peripheral surface of the brush deformation restricting part defining a circular holder opening having a smaller diameter than an inner diameter of the holder lower part, and a center axis of the brush accommodating space and a center axis of the holder opening substantially coinciding with the axis of the brush rotation shaft; and
    a brush body that integrally has
        a held part having a circular column shape that is incapable of penetrating through the holder opening and accommodated and held in the brush accommodating space, and
        a cleaning part having a circular column shape that is smaller in diameter than the held part and capable of penetrating through the holder opening, and penetrating through the holder opening and projecting downward in a brush attached state in which the held part is held in the brush accommodating space in the holder attached state, and in the brush attached state, lets a lower surface of the cleaning part contact the substrate from above to clean the substrate, wherein a top-to-bottom length of the holder opening of the brush holder is longer than or equal to ¼ of a protruding length of the cleaning part of the brush body from the held part thereof and shorter than the protruding length of the cleaning part.

2. The substrate cleaning brush according to claim 1, wherein on the inner peripheral surface of the holder lower part, a plurality of protrusions are formed which elastically deform part of an outer peripheral surface of the held part of the brush body accommodated in the brush accommodating space radially inward.

3. The substrate cleaning brush according to claim 1, wherein on the inner peripheral surface of the holder lower part, a plurality of protrusions are formed which elastically deform part of an outer peripheral surface of the held part of the brush body accommodated in the brush accommodating space radially inward.

4. A substrate cleaning brush that cleans a substrate by rotating together with a brush rotation shaft of a substrate cleaning apparatus whose axis extends in an up-down direction, comprising:

a brush holder that has a holder upper part to be attached to a lower end of the brush rotation shaft, a cylindrical holder lower part extending downward from the holder upper part in a holder attached state in which the holder upper part is attached to the brush rotation shaft, a hollow disc-shaped holder bottom plate part protruding radially inward from an inner edge of a lower end of the holder lower part in the holder attached state, a cylindrical brush deformation restricting part protruding downward from the inner peripheral edge of the holder bottom plate part, in the holder attached state, a lower surface of the holder upper part, an inner peripheral surface of the holder lower part, and an upper surface of the holder bottom plate part defining a brush accommodating space, and an inner peripheral edge of the holder bottom plate part and an inner peripheral surface of the brush deformation restricting part defining a circular holder opening having a smaller diameter than an inner diameter of the holder lower part; and a brush body that integrally has a held part having a circular column shape that is incapable of penetrating through the holder opening and accommodated and held in the brush accommodating space, and a cleaning part having a circular column shape that is smaller in diameter than the held part and capable of penetrating through the holder opening, and penetrating through the holder opening and projecting downward in a brush attached state in which the held part is held in the brush accommodating space in the holder attached state, and in the brush attached state, lets a lower surface of the cleaning part contact the substrate from above to clean the substrate.

5. The substrate cleaning brush according to claim 1, wherein a top-to-bottom length of the holder opening of the brush holder is longer than or equal to ¼ of a protruding length of the cleaning part of the brush body from the held part thereof and shorter than the protruding length of the cleaning part.

6. The substrate cleaning brush according to claim 4, wherein a center axis of the brush accommodating space and a center axis of the holder opening substantially coinciding with the axis of the brush rotation shaft.

\* \* \* \* \*